United States Patent
Wang et al.

(10) Patent No.: US 7,102,548 B1
(45) Date of Patent: Sep. 5, 2006

(54) CASCADED INTEGRATOR COMB FILTER WITH ARBITRARY INTEGER DECIMATION VALUE AND SCALING FOR UNITY GAIN

(75) Inventors: Shenq-Huey Wang, Parker, TX (US); William D. Elliott, Parker, TX (US); Xiemei Meng, Allen, TX (US)

(73) Assignee: Quickfilter Technologies, Inc., Allen, TX (US)

( * ) Notice: Subject to any disclaimer, the term of this patent is extended or adjusted under 35 U.S.C. 154(b) by 0 days.

(21) Appl. No.: 11/219,415

(22) Filed: Sep. 2, 2005

(51) Int. Cl.
*H03M 7/00* (2006.01)
*G06F 17/17* (2006.01)

(52) U.S. Cl. ........................................ 341/61; 708/313
(58) Field of Classification Search ................ 341/61; 708/313
See application file for complete search history.

(56) References Cited

U.S. PATENT DOCUMENTS

| | | | |
|---|---|---|---|
| 5,148,167 A | | 9/1992 | Ribner |
| 5,408,235 A | | 4/1995 | Doyle et al. |
| 5,455,782 A | * | 10/1995 | Young et al. ............... 708/313 |
| 6,161,118 A | * | 12/2000 | Lu .............................. 708/313 |

FOREIGN PATENT DOCUMENTS

JP          10051269 A  *  2/1998

OTHER PUBLICATIONS

Intersil HSP43220 Decimating Digital Filter Data Sheet, Jul. 2004, FN2486.9.
Xilinx Cascaded Integrator-Comb (CIC) Filter V3.0, Mar. 14, 2002.
E. B. Hogenauer, "An Economical Class of Digital Filters for Decimation and Interpolation", IEEE Transactions on Acoustic, Speech and Signal Processing, vol. 29, No. 2, pp. 150, no date.
GC4016 Multi-Standard Quad DDC Chip Data Sheet, Rev 1.0, Aug. 27, 2001, SLWS133A, Texas Instruments.

* cited by examiner

*Primary Examiner*—Howard L. Williams
(74) *Attorney, Agent, or Firm*—John A. Thomas

(57) ABSTRACT

We disclose a CIC digital filter having an arbitrary-integer decimation rate. The filter has a shifter connected to its input. The shifter receives a shift control input, where the shift control input is pre-computed as equal to the integer portion of 2 raised to the base-2 logarithm of the gain of the CIC filter. There is a multiplier connected between the input and the shifter. In other embodiments, the multiplier could be connected between the input and the shifter. Sequentially-connected integrator functions are connected to the shifter (or multiplier); a decimation function receives input from the integrator functions; and sequentially-connected differentiator functions receive input from the decimation function. The decimation function has a selectable rate equal to any integer between 1 and a number equal to the predetermined maximum decimation value. The multiplier is configured to compute the product of each input data sample by a correction factor; the correction factor being pre-computed as equal to the fractional portion of 2 raised to the base-2 logarithm of the gain of the CIC filter, so as to correct the gain of the CIC filter for decimation values not a power of 2.

31 Claims, 4 Drawing Sheets

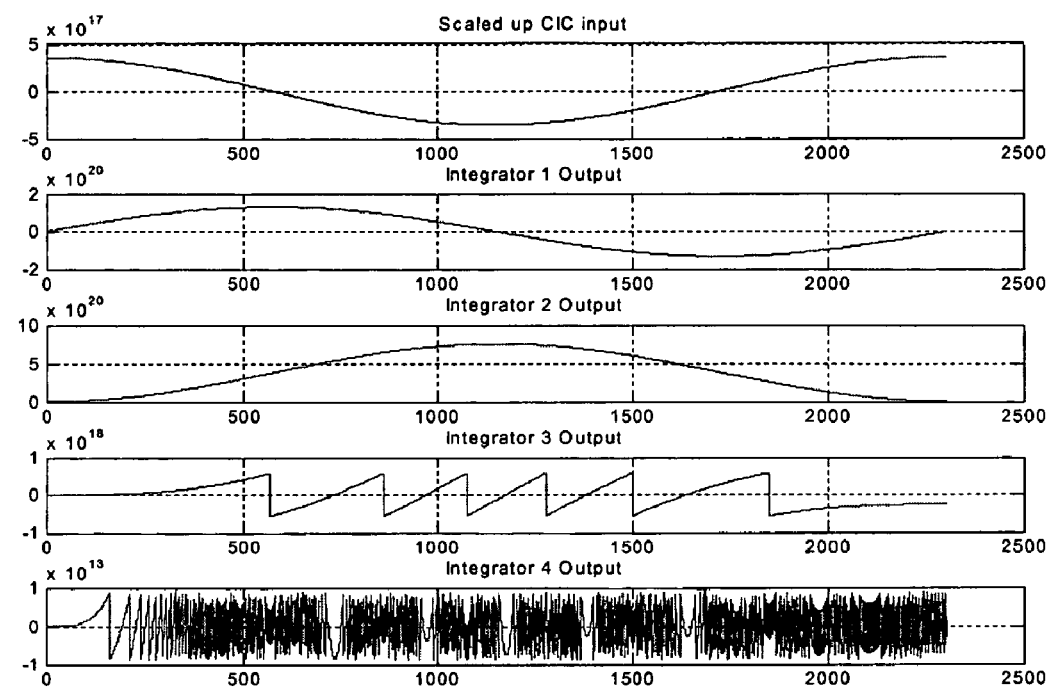
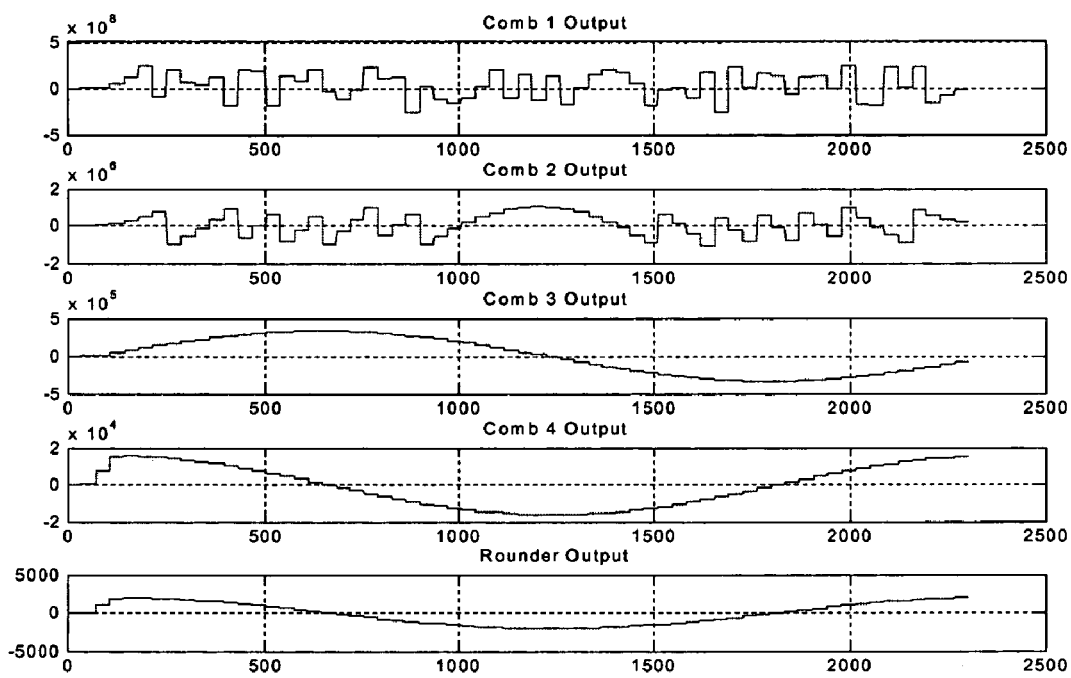
Fig. 4

CASCADED INTEGRATOR COMB FILTER WITH ARBITRARY INTEGER DECIMATION VALUE AND SCALING FOR UNITY GAIN

TECHNICAL FIELD

This disclosure relates to digital signal processing applications that require the use of Cascaded Integrator-Comb (CIC) filters. Such filters are often used with over-sampled Analog to Digital Converters (ADC's) to reduce the sample rate of the ADC to the sample rate of interest to the application, and to reduce the aliasing effects generated by the ADC sampling process.

BACKGROUND

CIC filters deployed to date are frequently used in digital down-converter applications, as they permit a more efficient hardware implementation than alternate finite-impulse response filters with decimation or a conventional averaging technique. If constrained to powers-of-two decimation values, the CIC can be implemented without multiply or divide operations, but must use very large bit width adders and accumulators for the large values of decimation or interpolation often required in current digital filtering applications.

The problem with the current approach is the granularity of the selectable output sample rate. As an example, consider a CIC filter with powers-of two decimation values from 8 to 16,384 ($2^3$ to $2^{14}$). Thus, if the input sample rate is, for example, 16 MHz, the discrete output sample rates available are 2 MHz, 1 MHz, 500 KHz, ... 3.91 KHz, 1.95 KHz, and 0.98 KHz. Since the output sample rate of the CIC is typically input to a digital filter, and to minimize the number of taps required for these follow-on filters, it is highly desirable to improve the granularity of the R values. As an example, an FIR filter with a sharp cutoff frequency at 250 KHz would, with powers-of-two decimation, require a sample rate of 1 MHz and require 507 taps to achieve 80 dB of attenuation with less than 1 dB of ripple. If integer R values were available, the sample rate could be set at 516 KHz (R=31) and the filter would require only 235 taps, improving filter latency and processing throughput and power requirements.

SUMMARY

We disclose a CIC digital filter allowing for arbitrary-integer decimation rates. The filter has a shifter connected to its input. The shifter receives a shift control input, where the shift control input is pre-computed as equal to the integer portion of 2 raised to the base-2 logarithm of the gain of the CIC filter. There is a multiplier connected between the input and the shifter. In other embodiments, the multiplier could be connected between the input and the shifter.

There are at least four sequentially-connected integrator functions connected to the shifter (or multiplier, as the case may be); a decimation function receiving input from the integrator functions; and at least four sequentially-connected differentiator functions receiving input from the decimation function. The decimation function has a selectable rate equal to any integer between 1 and a number equal to the predetermined maximum decimation value. The multiplier is configured to compute the product of each input data sample by a correction factor; the correction factor being pre-computed as equal to the fractional portion of 2 raised to the base-2 logarithm of the gain of the CIC filter, so as to correct the gain of the CIC filter for decimation values not a power of 2.

We also disclose a method of implementing a multi-channel CIC filter for filtering input data samples from a multiple data stream; the multi-channel CIC filter having an input, an output, a shifter, a shift control, a multiplier, a demultiplexer, and a plurality of channels. Each channel has one or more integrator functions, a decimation function, and one or more differentiator functions. The method comprises receiving an input stream of multiplexed data samples; shifting each data sample by a left shift equal to the integer portion of the base-2 logarithm of the CIC filter gain; and, multiplying each so shifted data sample by the fractional portion of the base-2 logarithm of the CIC filter gain. The multiplexed data stream is demultiplexed into two or more data streams. For each data stream, the method includes integrating the shifted and multiplied data sample at least once; decimating the data sample by a pre-determined decimation rate; differentiating the decimated data sample at least once; and, rounding the differentiated data sample to a predetermined number of bits before outputting the data sample.

DRAWINGS

FIG. 4 shows representative wave forms for the input to, and output of, the various stages in an example CIC filter.

DESCRIPTION

Figure 1:
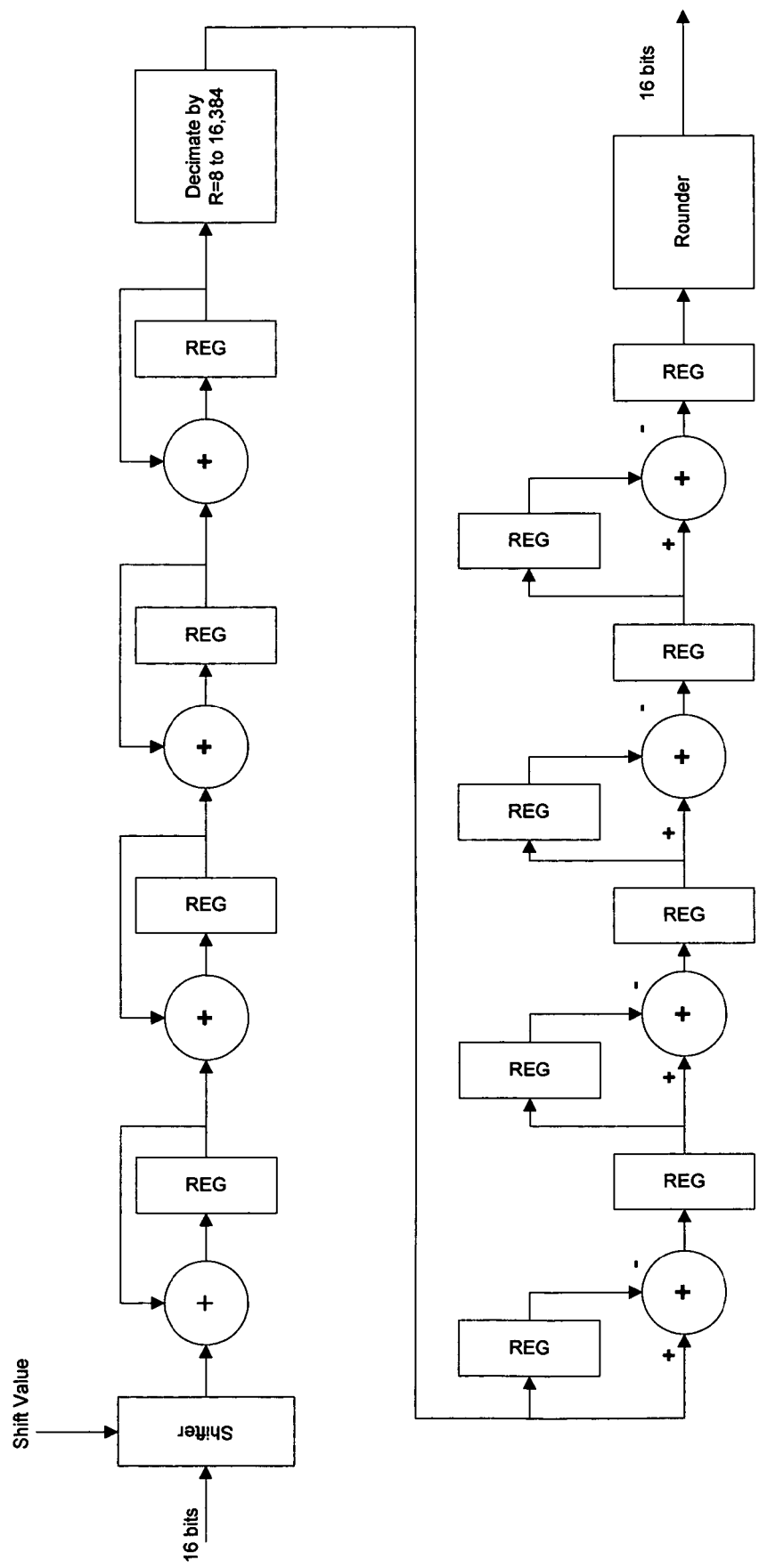
FIG. 1 illustrates a prior-art four stage CIC filter permitting programmable decimation of up to 16,384 ($2^{14}$) for decimation values that are integer powers of 2.

FIG. 1 illustrates a prior-art four stage CIC filter permitting programmable decimation of up to 16,384 ($2^{14}$). The shift register at the beginning of the pipeline is used to set a shift value that will maintain unity gain for the programmed decimation value (R) of the filter. This constrains the decimation value to integer powers of two, resulting in 14 discrete decimations settings of 1, 2, 4, 8, ... 16,384. The decimator outputs 1 of R inputs to perform the down-sampling function. The adders and registers are sized to accumulate very large numbers, but can be truncated by a few bits at each stage to eliminate bits that do not affect the output precision.

Figure 2:
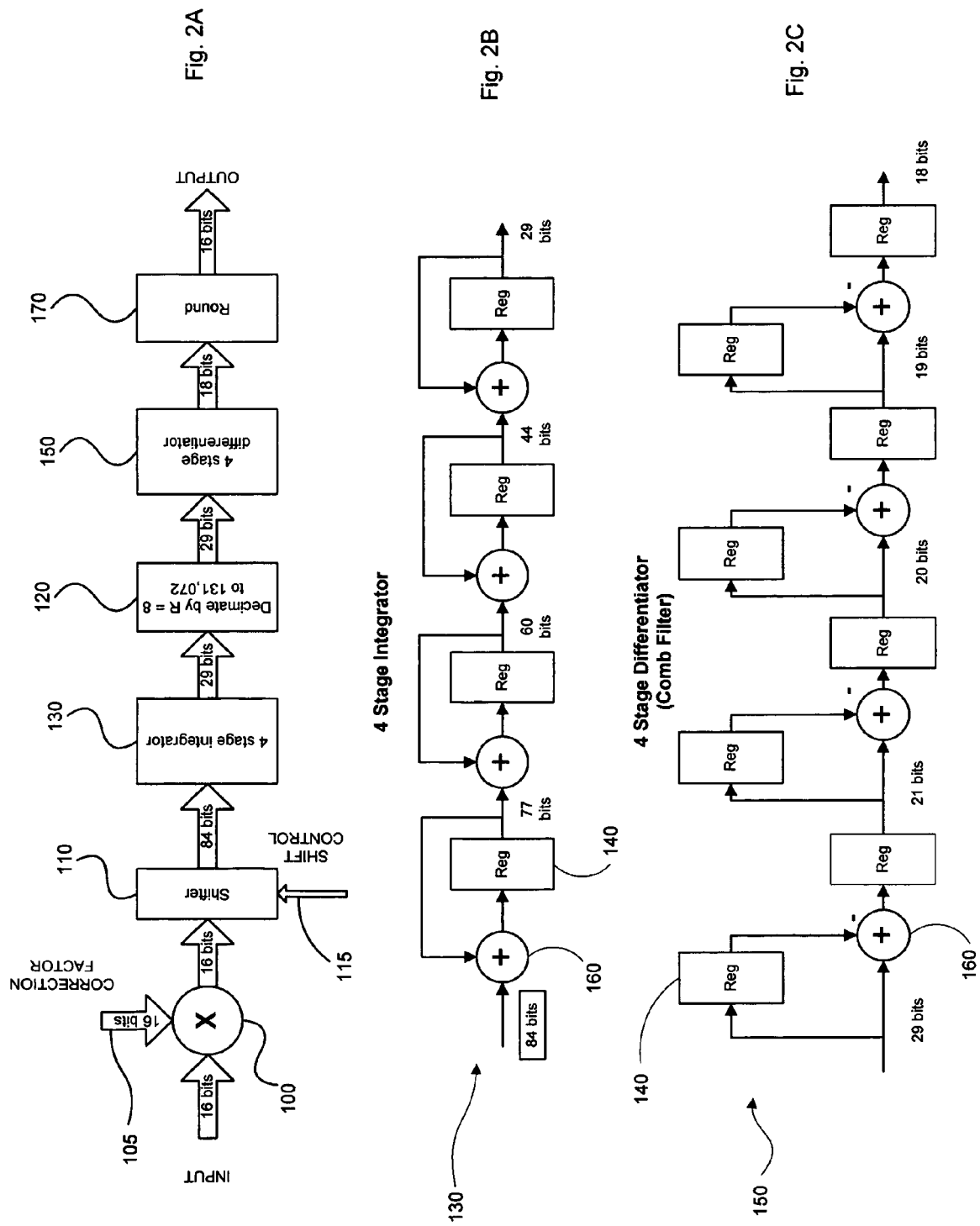
FIG. 2 illustrates a CIC filter with arbitrary integer values of decimation up to 131,072.

FIG. 2 illustrates a CIC filter according to the preferred embodiment with integer values of decimation up to 131, 072. This capability is achieved by adding a multiplier (100) before the shift register (110) at the input of the CIC to adjust the gain for values between the powers of two adjustments in the shift register (110). To perform the programming for a particular integer value of R, the gain value in the shifter (110) and the multiplier (100) must equal the drop in dynamic range of the CIC filter per the following equation for a four-stage CIC filter:

$$\text{CIC Gain} = (RMAX/R)^4 = 2^{\text{integer portion of } \log_2(CIC\ Gain)} \times 2^{\text{fractional portion of } \log_2(CIC\ Gain)}$$

where RMAX is the maximum decimation rate designed into the system.

This can be implemented in digital hardware by a shift operation for the integer portion of the gain and a multiplication for the fractional portion of the gain. Note that, for power of two decimation values, only a shifter is required.

Thus, the shift control value (115) applied as a left shift in the shifter (110) would be 2 raised to the integer portion of $\log_2$ (CIC Gain), and the correction factor (105) applied to the multiplier (100) would be 2 raised to the fractional portion of $\log_2$ (CIC Gain).

As an example, a desired decimation value of R=36 (not a power of two) in the four-stage filter would generate a shift control value of 47 and a multiplier correction value of 1.24859. (All numbers are in 16-bit two's complement format in the example.) An equivalent multiplier could use floating-point arithmetic, although at the cost of additional hardware complexity. The integrator and differentiator sections (130 and 150) are conventionally built of such registers (140) and adders (160), with appropriate feedback or feed-forward as shown. In FIG. 2, the boxes denoted "REG" are the conventional registers (140) used in CIC filters for holding intermediate results, with the outputs truncated as indicated. A rounder (170) after the differentiator section (150) rounds the result to the bit width desired for the output sample The reader will see that if greater attenuation in the stop band is required, additional integrator and differentiator stages could be added to the CIC filter just described. It should also be noted that the input bit width can be any value. The registers and adders must be sized for the maximum input precision desired. One could, for example, input 12 bits and output a precision of 16 bits with a decimation value of at least 256, since the CIC is an averaging filter and will "average out" uniform noise.

Figure 3:
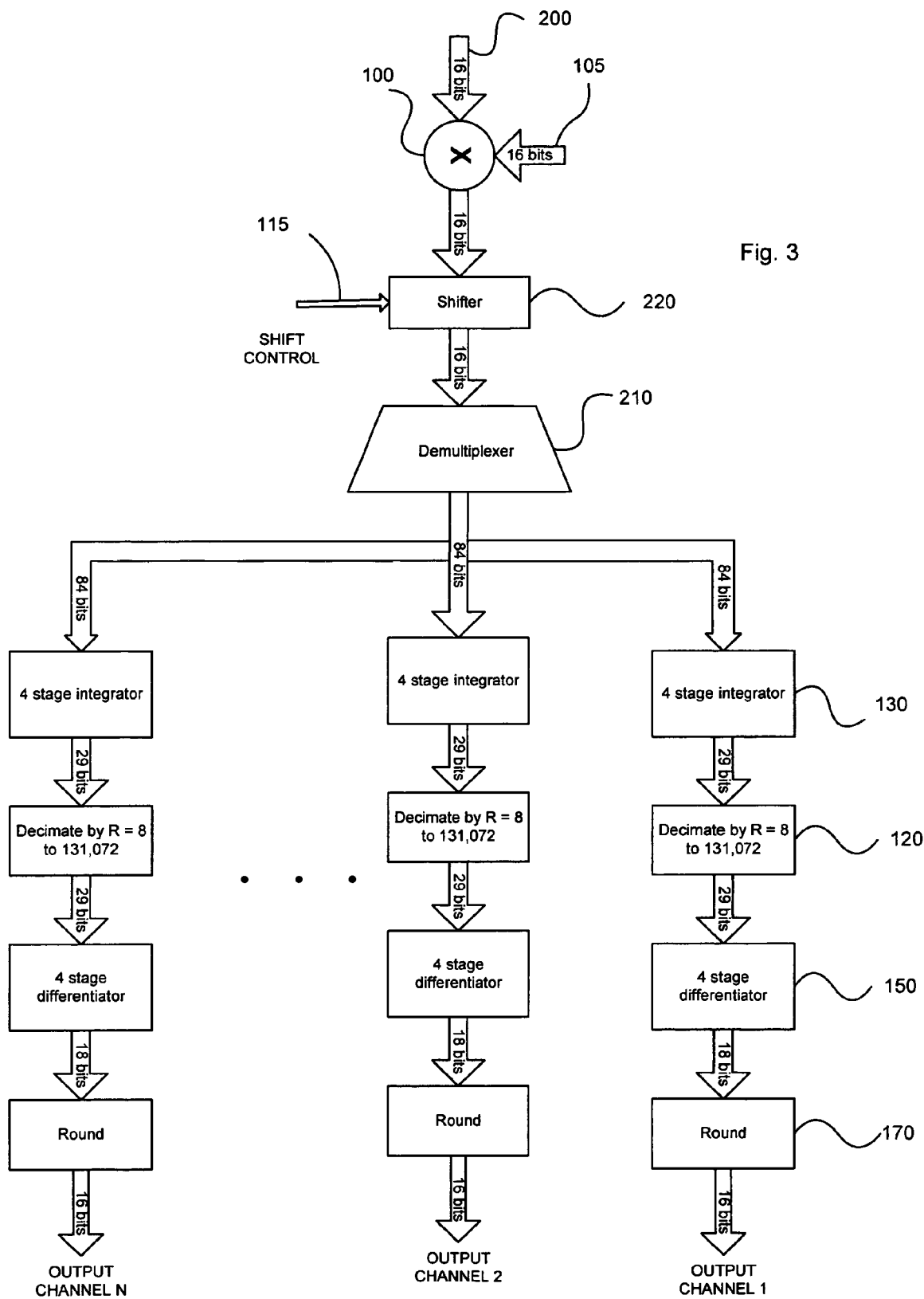
FIG. 3 shows an alternate embodiment of the CIC filter receiving a multiplexed data stream and having multiple channels of output.

A multi-channel system with, for example, a single ADC multiplexing conversions from N input channels and then outputting the result to N CIC channels, can be implemented by sharing the multiplier and shifter. The same multiplier and shifter can be used to supply any additional gain correction needed as a result of inaccuracies in the amplification and analog to digital conversion processes. An alternate embodiment having multiple channels of output is depicted in FIG. 3, where the input channel (200) of multiplexed input is multiplied by the correction factor in a single multiplier (100), shifted in a single shifter (230) by a shift correction factor as before, and demultiplexed into separate data channels by a demultiplexer (210).

The integrator section (130) of the CIC filter in FIG. 2 is clocked at the input data rate. The differentiator section (150) is clocked at the input data rate divided by R, the decimation rate. Thus the CIC filter down-converts the input signal sample rate and bandwidth by R.

Experiments in a mixed-signal CMOS integrated circuit have shown that the CMOS implementation of this solution is only about 13% larger than the powers-of-two solution for a single channel of input data. However, in a multi-channel system with, for example, a single ADC multiplexing conversions from N input channels and then outputting the result to N CIC channels, the multiplier and shifter can be shared, further reducing the cost, as shown in FIG. 3. Matlab simulations of the CIC for an R value of 36 are shown in FIG. 4. FIG. 4A shows the integrator waveforms, and FIG. 4B shows the differentiator (CIC) wave forms for the example filter. These demonstrate that the scaling up by the multiply and shift factors at the front of the CIC results in unity gain at the output; e.g., a 12 bit input cosine waveform produces a dynamic range of 4096 at the output, and the signal is faithfully reproduced.

In conclusion, the technique described in this invention shows that any integer decimation value can be chosen as needed to fit the application up to the design maximum of the hardware. The addition of the multiplier provides R maximum–$\log_2$ R additional discrete values of decimation. The design benefits outweigh the 13% or less increased cost of additional hardware.

We claim:

1. A CIC digital filter for filtering input data samples, comprising:
   at least one integrator function;
   a decimation function receiving input from the integrator function;
   at least one differentiator function receiving input from the decimation function;
   a multiplier connected between the input and the integrator function;
   a shifter connected to output of the multiplier; and,
   the multiplier configured to compute the product of each input data sample by a correction factor, so as to correct the gain of the CIC filter for decimation values not a power of 2.

2. The CIC filter of claim 1, where the correction factor is pre-computed as equal to the fractional portion of 2 raised to the base-2 logarithm of the gain of the CIC filter.

3. The CIC filter of claim 1, further comprising the shifter receiving a shift control input; the shift control input being pre-computed as equal to the integer portion of 2 raised to the base-2 logarithm of the gain of the CIC filter.

4. The CIC filter of claim 1, comprising four sequentially-connected integrator functions and four sequentially-connected differentiator functions.

5. The CIC filter of claim 1, where the decimation function operates at any decimation rate from 1 to 131,072.

6. A CIC digital filter for filtering input data samples; the filter having an input for data samples; the filter comprising:
   a shifter connected to the input; the shifter receiving a shift control input; the shift control input being pre-computed as equal to the integer portion of 2 raised to the base-2 logarithm of the gain of the CIC filter;
   a multiplier connected between the input and the shifter;
   at least four sequentially-connected integrator functions connected to the shifter;
   a decimation function receiving input from the integrator functions;
   at least four sequentially-connected differentiator functions receiving input from the decimation function; the decimation function having a selectable rate equal to any integer between 1 and a number equal to the predetermined maximum decimation value; and,
   the multiplier configured to compute the product of each input data sample by a correction factor; the correction factor being pre-computed as equal to the fractional portion of 2 raised to the base-2 logarithm of the gain of the CIC filter, so as to correct the gain of the CIC filter for decimation values not a power of 2.

7. A method of implementing a CIC filter having an input, an output, a shifter, a shift control, a multiplier, one or more integrator functions, a decimation function, and one or more differentiator functions, the method comprising:
   receiving an input stream of data samples;
   shifting each data sample by a left shift equal to the integer portion of the base-2 logarithm of the CIC filter gain;
   multiplying each so shifted data sample by the fractional portion of the base-2 logarithm of the CIC filter gain;
   integrating the shifted and multiplied data sample at least once;
   decimating the data sample by a pre-determined decimation rate;

differentiating the decimated data sample at least once; and, rounding the differentiated data sample to a pre-determined number of bits before outputting the data sample.

8. The method of claim 7 where the data sample is integrated a plurality of times.

9. The method of claim 7 where the data sample is differentiated a plurality of times.

10. The method of claim 7 where the decimation rate is an arbitrary integer between 1 and a number equal to a predetermined maximum decimation value.

11. An integrated circuit for performing a CIC digital filter function; the integrated circuit comprising:
at least one integrator;
a decimator; the decimator receiving input from the integrator;
at least one differentiator receiving input from the decimator;
a multiplier connected to the input;
a shifter connected between the output of the multiplier and to the integrator; and,
the multiplier configured to compute the product of each input data sample by a correction factor, so as to correct the gain of the CIC filter for decimation values not a power of 2.

12. The integrated circuit of claim 11, where the correction factor is pre-computed as equal to the fractional portion of 2 raised to the base-2 logarithm of the gain of the CIC filter.

13. The integrated circuit of claim 11, further comprising the shifter receiving a shift control input; the shift control input being pre-computed as equal to the integer portion of 2 raised to the base-2 logarithm of the gain of the CIC filter.

14. The integrated circuit of claim 11, comprising four sequentially-connected integrators and four sequentially-connected differentiators.

15. The integrated circuit of claim 11, where the decimator operates at any decimation rate from 1 to a predetermined maximum decimation value.

16. An integrated circuit for performing a CIC digital filter function for filtering input data samples, comprising:
a shifter; the shifter connected to the input; the shifter receiving a shift control input; the shift control input being pre-computed as equal to the integer portion of 2 raised to the base-2 logarithm of the gain of the CIC filter;
a multiplier connected to the shifter;
at least four sequentially-connected integrators connected to the multiplier;
a decimator receiving input from the integrators;
at least four sequentially-connected differentiators receiving input from the decimator; the decimator having a selectable rate equal to any integer between 1 and a number equal to a predetermined maximum decimation value; and,
the multiplier configured to compute the product of each input data sample by a correction factor; the correction factor being pre-computed as equal to the fractional portion of 2 raised to the base-2 logarithm of the gain of the CIC filter, so as to correct the gain of the CIC filter for decimation values not a power of 2.

17. A multi-channel CIC digital filter for filtering input data samples from a multiplexed data stream, comprising:
a multiplier connected to the input;
a shifter connected to the multiplier;
a demultiplexer connected to the shifter for demultiplexing the multiplexed data stream into two or more data streams;
where each demultiplexed data stream is input to:
at least one integrator function;
a decimation function receiving input from the integrator function;
at least one differentiator function receiving input from the decimation function;
the multiplier and shifter configured to compute the product of the input data samples by a correction factor, so as to correct the gain of the multi-channel CIC filter for decimation values not a power of two.

18. The multi-channel CIC filter of claim 17, where the correction factor is pre-computed as equal to the fractional portion of 2 raised to the base-2 logarithm of the gain of the CIC filter.

19. The multi-channel CIC filter of claim 17, further comprising the shifter receiving a shift control input; the shift control input being pre-computed as equal to the integer portion of 2 raised to the base-2 logarithm of the gain of the CIC filter.

20. The multi-channel CIC filter of claim 17, where each channel comprises four sequentially-connected integrator functions and four sequentially-connected differentiator functions.

21. The CIC filter of claim 17, where the decimator operates at any decimation rate from 1 to 131,072.

22. A method of implementing a multi-channel CIC filter for filtering input data samples from a multiple data stream; the multi-channel CIC filter having an input, an output, a shifter, a shift control, a multiplier, a demultiplexer, and a plurality of channels; each channel having one or more integrator functions, a decimation function, and one or more differentiator functions, the method comprising:
receiving an input stream of multiplexed data samples;
shifting each data sample by a left shift equal to the integer portion of the base-2 logarithm of the CIC filter gain;
multiplying each so shifted data sample by the fractional portion of the base-2 logarithm of the CIC filter gain;
demultiplexing the multiplexed data stream into two or more data streams;
for each data stream:
integrating the shifted and multiplied data sample at least once;
decimating the data sample by a pre-determined decimation rate;
differentiating the decimated data sample at least once; and,
rounding the differentiated data sample to a pre-determined number of bits before outputting the data sample.

23. The method of claim 22 where each data sample is integrated a plurality of times.

24. The method of claim 22 where each data sample is differentiated a plurality of times.

25. The method of claim 22 where the decimation rate is an arbitrary integer between 1 and a number equal to a predetermined maximum decimation value.

26. An integrated circuit for performing a multi-channel CIC digital filter function on a multiplexed stream of data samples; the integrated circuit comprising:
a multiplier connected to the input;
a shifter connected to the multiplier;

a demultiplexer connected to the shifter for demultiplexing the multiplexed data stream into two or more channels, each channel comprising a demultiplexed data stream;

where each channel further comprises:
- at least one integrator;
- a decimator; the decimator receiving input from the integrator;
- at least one differentiator receiving input from the decimator; and, the multiplier and shifter configured to compute the product of each input data sample by a correction factor, so as to correct the gain of the CIC filter for decimation values not a power of 2.

27. The integrated circuit of claim 26, where the correction factor is pre-computed as equal to the fractional portion of 2 raised to the base-2 logarithm of the gain of the multi-channel CIC filter.

28. The integrated circuit of claim 26, further comprising the shifter receiving a shift control input; the shift control input being pre-computed as equal to the integer portion of 2 raised to the base-2 logarithm of the gain of the multi-channel CIC filter.

29. The integrated circuit of claim 26, where each channel comprises four sequentially-connected integrators and four sequentially-connected differentiators.

30. The integrated circuit of claim 26, where each decimator operates at any decimation rate from 1 to a predetermined maximum decimation value.

31. An integrated circuit for performing a multi-channel CIC digital filter function on a multiplexed stream of data samples, comprising:
- a multiplier connected to the input; the multiplier configured to compute the product of each input data sample by a correction factor; the correction factor being pre-computed as equal to the fractional portion of 2 raised to the base-2 logarithm of the gain of the CIC filter, so as to correct the gain of the CIC filter for decimation values not a power of 2; and,
- a shifter connected to the multiplier; the shifter receiving a shift control input; the shift control input being pre-computed as equal to the integer portion of 2 raised to the base-2 logarithm of the gain of the CIC filter;
- a demultiplexer connected to the shifter for demultiplexing the multiplexed data stream into two or more channels; where each channel comprises a demultiplexed data stream;

where each channel further comprises:
- at least four sequentially-connected integrators;
- a decimator receiving input from the integrators;
- at least four sequentially-connected differentiators receiving input from the decimator; the decimator having a selectable rate equal to any integer between 1 and a number equal to a predetermined maximum decimation value.

* * * * *